United States Patent
Misaizu et al.

(10) Patent No.: US 7,382,987 B2
(45) Date of Patent: Jun. 3, 2008

(54) IDENTIFICATION LEVEL CONTROL METHOD AND OPTICAL RECEIVER

(75) Inventors: Setsuo Misaizu, Yokohama (JP); Yuko Yoshida, Yokohama (JP); Tetsuji Sato, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 518 days.

(21) Appl. No.: 10/821,853

(22) Filed: Apr. 12, 2004

(65) Prior Publication Data

US 2005/0078966 A1 Apr. 14, 2005

(30) Foreign Application Priority Data

Oct. 9, 2003 (JP) ............... 2003-350707

(51) Int. Cl.
*H04B 10/06* (2006.01)

(52) U.S. Cl. ...................... 398/202; 398/209

(58) Field of Classification Search ......... 398/208–211
See application file for complete search history.

(56) References Cited

U.S. PATENT DOCUMENTS 5,896,391 A * 4/1999 Solheim et al. ............. 714/704
6,519,302 B1 * 2/2003 Bruce et al. ................ 375/355
6,735,259 B1 * 5/2004 Roberts et al. ............. 375/316
6,822,214 B2 * 11/2004 Han et al. ............... 250/214 R
6,826,372 B1 * 11/2004 Givehchi .................... 398/209

FOREIGN PATENT DOCUMENTS

JP 60-197051 10/1985
JP 2003-018140 1/2003

* cited by examiner

*Primary Examiner*—Jason Chan
*Assistant Examiner*—Nathan Curs
(74) *Attorney, Agent, or Firm*—Staas & Halsey LLP

(57) ABSTRACT

An identification level control method and an optical receiver are disclosed to determine an optimal identification level in a simple structure without clock extraction. In the identification level control method, an identification level supplied to a limiter amplifier is changed from a lower bound to an upper bound thereof and is stored together with an output average of the limiter amplifier. Then, a first average and a second average are set based on the output average. A first identification level corresponding to the first average and a second identification level corresponding to the second average are obtained, and an optimal identification level is computed based on the first identification level and the second identification level, and is supplied to the limiter amplifier.

12 Claims, 9 Drawing Sheets

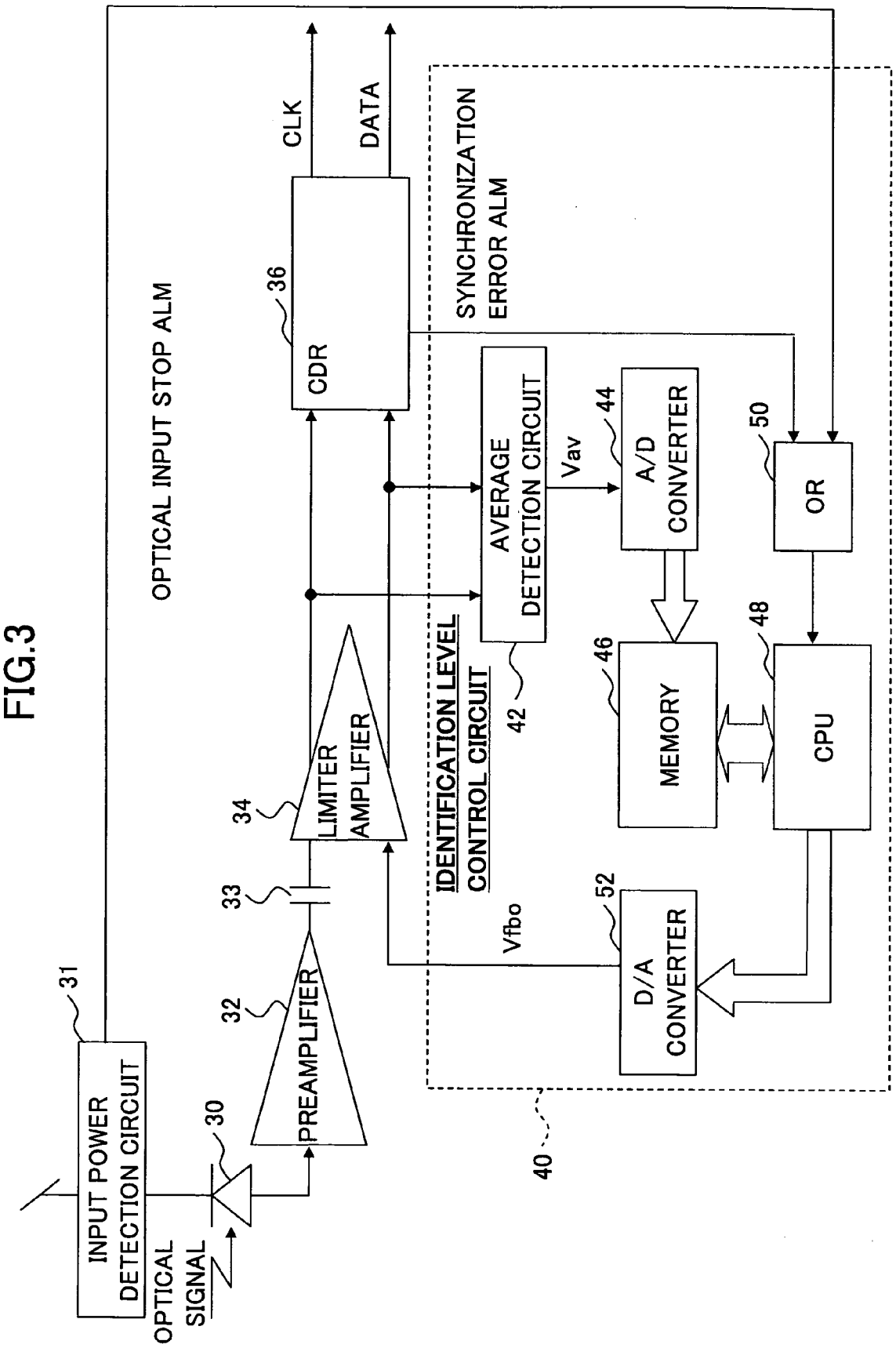

IDENTIFICATION LEVEL CONTROL METHOD AND OPTICAL RECEIVER

CROSS-REFERENCE TO RELATED APPLICATIONS

The present application is based on Japanese priority application No. 2003-350707 filed Oct. 9, 2003, the entire contents of which are hereby incorporated by reference.

BACKGROUND OF THE INVENTION

1. Field of the Invention

The present invention relates to an identification level control method and an optical receiver in accordance with the identification level control method. More particularly, the present invention relates to an identification level control method for an optical receiver that converts an optical signal from an optical fiber into an electric signal and reproduces data after amplification of the converted electric signal by a limiter amplifier, and an optical receiver in accordance with the identification level control method.

2. Description of the Related Art

In an optical transmitter to receive an optical signal transmitted from an optical fiber at a high speed, for example, at 10 Gbps (Gigabits per second), an identification level has to be optimally maintained independently of a transmission distance of the optical fiber.

FIG. 1 is a block diagram illustrating an exemplary structure of a conventional optical receiver.

Referring to FIG. 1, an incoming optical signal from an optical fiber is converted into a current signal by a light receiving element 10, and then the converted current signal is converted into a voltage signal by a preamplifier 12. A limiter amplifier 14 amplifies a signal supplied from the preamplifier 12 via a capacitor 13 to an amplitude level identifiable by CDR (Clock & Data Recovery) 16. CDR 16 extracts a synchronization clock from the signal supplied from the limiter amplifier 14. Then, CDR 16 reproduces data by using the synchronization clock, and supplies the clock CLK and the data DATA to the next stage.

In general, a high gain (about 30 dB to 40 dB) differential amplifier is used as the limiter amplifier 14. In this case, however, the optical receiver may have insufficient receiving sensitivity, because an input offset voltage arises due to non-uniformity and temperature characteristics of transistors in the limiter amplifier 14. In order to prevent occurrence of such an input offset voltage, a direct current (DC) feedback circuit 20 is provided to monitor for a forward output and a backward output and compensate for the input offset voltage.

In the DC feedback circuit 20, an average detection circuit 22 detects an average of the forward output and the backward output of the limiter amplifier 14, and an amplifier 24 differentially-amplifies the detected average. The DC feedback circuit 20 controls an input voltage supplied opposite to a main signal input of the limiter amplifier 14 so that these input voltages can become equal. In order to make the voltages of the forward and backward outputs of the limiter amplifier 14 different intentionally, an offset voltage Voff from an offset circuit 26 is added to the average Vav.

Japanese Laid-Open Patent Application No. 60-197051 discloses a technique for detecting a code error of a signal identified for an incoming digital signal by an identification device and controlling an identification determination value of the identification device to make the code error alleviated.

Also, the phases of an input signal and an oscillation output are synchronized to make a difference between the phases fixed. Then, a clock timing corresponding to the transmission rate of the input signal is extracted, and the phase of the detected clock is sequentially swept to a voltage threshold for the input signal in a reproduction control circuit. Furthermore, it is determined whether levels of adjacent monitor points are the same, and data reproduction is controlled by using an identification point, where errors least occur in an eye pattern effective area, as an optimal point.

Ideally, it is desirable that an identification level be maintained at an optimal level of an input waveform, that is, at a BER (Bit Error Rate) minimum level. However, it is not practical to install a large-scale circuit to detect BER into an optical receiver. Also, another method of maintaining an identification level at an optimal level based on a feedback signal from a FEC (Forward Error Correction) circuit is proposed. However, such a method cannot be applied to transmission systems without a FEC circuit.

Accordingly, in a conventional optical receiver, an optimally adjusted identification level is fixed and maintained stably. However, as an optical transmission speed is higher, waveform distortion due to dispersion of the optical fiber becomes more influential.

FIGS. 2A and 2B show exemplary optical waveform before and after optical fiber transmission of 10 Gbps, respectively. As shown in FIGS. 2A and 2B, an optical waveform has some distortion features. The first feature is that a large overshoot occurs. The second feature is that cross points of rising curves and falling curves are positioned downward and the duty cycle becomes small.

The limiter amplifier 14 shown in FIG. 1 has no AGC (Auto Gain Control) function. Accordingly, if an input amplitude is large, an output amplitude of the limiter amplifier 14 is limited. Specifically, the amplification is performed in a condition where the input waveform is partially cut.

If the offset voltage Voff of the offset circuit 26 is zero, the amplifier 24 operates to make an forward output and a backward output of the limiter amplifier 14 equal to the average voltage thereof. Accordingly, in an output of the limiter amplifier 14, an area "a" in the vicinity of cross points of an input waveform is cut, as illustrated in FIG. 2A. Since a portion of the optical input waveform is cut in the limiter amplifier 14, such a cutting level in the limiter amplifier 14 substantially becomes equivalent to an identification level.

If the dispersion value of an optical fiber is fixed, the identification level can be optimally regulated depending on the dispersion value. In fact, however, the dispersion value is variable depending on transmission distances and kinds of optical fibers. Also, the dispersion value may vary during operation in a system, in which a transmission path changes during operation thereof, such as a recent metro transmission apparatus. For these reasons, it is necessary to widen a range of dispersion value (dispersion tolerance) receivable by an optical receiver as much as possible.

As shown in FIG. 2B, after optical fiber transmission, the cross points are positioned downward to the low level side (optical quench side). In such a case, a cut portion in the limiter amplifier 14 follows the cross points, and the area "b" at the low level side of the input waveform is cut and amplified. Accordingly, although the identification level is set around the center of the waveform before transmission, the identification level is shifted to the low level side after the transmission. This difference deletes a low level side noise margin, resulting in degradation of BER and limitation of the dispersion tolerance.

In actual optical transmission, the high level side (optical emission side) and the low level side have different S/N (Signal-to-Noise) ratios. Specifically, the high level side has a poor S/N ratio in general. Thus, it is necessary to set the optimal value of the identification level at the side slightly lower than the waveform center and adjust the limiter amplifier 14 to cut the side slightly lower than the waveform center. The offset circuit shown in FIG. 1 cuts the slightly lower side by additionally supplying the offset voltage Voff from the offset circuit 26 to the amplifier 24.

Japanese Laid-Open Patent Application No. 2003-018140 discloses a transmitter to address the above-mentioned problem. However, since the disclosed transmitter needs a PLL (Phase-Locked Loop) circuit to extract a clock, it is impossible to prevent a size increase of the circuit.

SUMMARY OF THE INVENTION

It is a general object of the present invention to provide an identification level control method and an optical receiver in which one or more of the above-mentioned problems are eliminated.

A more specific object of the present invention is to provide an identification level control method and an optical receiver that can be implemented in a simple structure to determine an optimal identification level.

In order to achieve the above-mentioned objects, there is provided according to one aspect of the present invention a method of controlling an identification level for an optical receiver wherein the optical receiver converts an optical signal from an optical fiber into an electric signal, uses a limiter amplifier to amplify the electric signal, and reproduces data, the method including steps of: changing an identification level supplied to the limiter amplifier from a lower bound to an upper bound thereof and storing an average of an output of the limiter amplifier together with the identification level; setting a first average of a minimal value of the average and a predefined value and a second average of a maximal value of the average and the predefined value, the predefined value being between the minimal value and the maximal value, and obtaining a first identification level corresponding to the first average and a second identification level corresponding to the second average; and computing an optimal identification level based on the first identification level and the second identification level and supplying the optimal identification level to the limiter amplifier.

Additionally, there is provided according to another aspect of the present invention an optical receiver for converting an optical signal from an optical fiber into an electric signal, using a limiter amplifier to amplify the electric signal, and reproducing data, including: a change part changing an identification level supplied to the limiter amplifier from a lower bound to an upper bound thereof; a storage part storing an average of an output of the limiter amplifier together with the identification level; and a computation part setting a first average of a minimal value of the average and a predefined value and a second average of a maximal value of the average and the predefined value, the predefined value being between the minimal value and the maximal value, obtaining a first identification level corresponding to the first average and a second identification level corresponding to the second average, computing an optimal identification level based on the first identification level and the second identification level, and supplying the optimal identification level to the limiter amplifier.

According to one aspect of the present invention, it is possible to determine an optimal identification level in a simple structure without clock extraction.

Additionally, there is provided according to another aspect of the present invention a method of controlling an identification level for an optical receiver wherein the optical receiver converts an optical signal from an optical fiber into an electric signal, uses a limiter amplifier to amplify the electric signal, and reproduces data, the method including steps of: changing an identification level supplied to a monitoring limiter amplifier from a lower bound to an upper bound thereof, the monitoring limiter amplifier configured to have a feature similar to the limiter amplifier and receiving the electric signal, and storing an average of an output of the monitoring limiter amplifier together with the identification level; setting a first average of a minimal value of the average and a predefined value and a second average of a maximal value of the average and the predefined value, the predefined value being between the minimal value and the maximal value, and obtaining a first identification level corresponding to the first average and a second identification level corresponding to the second average; and computing an optimal identification level based on the first identification level and the second identification level and supplying the optimal identification level to the limiter amplifier.

Additionally, there is provided according to another aspect of the present invention an optical receiver for converting an optical signal from an optical fiber into an electric signal, using a limiter amplifier to amplify the electric signal, and reproducing data, including: a monitoring limiter amplifier configured to have a feature similar to the limiter amplifier and receiving the electric signal; a change part changing an identification level supplied to the monitoring limiter amplifier from a lower bound to an upper bound thereof; a storage part storing an average of an output of the monitoring limiter amplifier together with the identification level; and a computation part setting a first average of a minimal value of the average and a predefined value and a second average of a maximal value of the average and the predefined value, the predefined value being between the minimal value and the maximal value, obtaining a first identification level corresponding to the first average and a second identification level corresponding to the second average, computing an optimal identification level based on the first identification level and the second identification level, and supplying the optimal identification level to the limiter amplifier.

According to one aspect of the present invention, it is possible to determine an optimal identification level and address cases in real-time where electric power of an input optical signal varies and an input offset of the limiter amplifier occurs during operation of the optical receiver.

Other objects, features and advantages of the present invention will become more apparent from the following detailed description when read in conjunction with the accompanying drawings.

BRIEF DESCRIPTION OF THE DRAWINGS

FIG. 3 is a block diagram illustrating an exemplary structure of an optical receiver according to a first embodiment of the present invention;

DETAILED DESCRIPTION OF THE PREFERRED EMBODIMENTS

Figure 1:
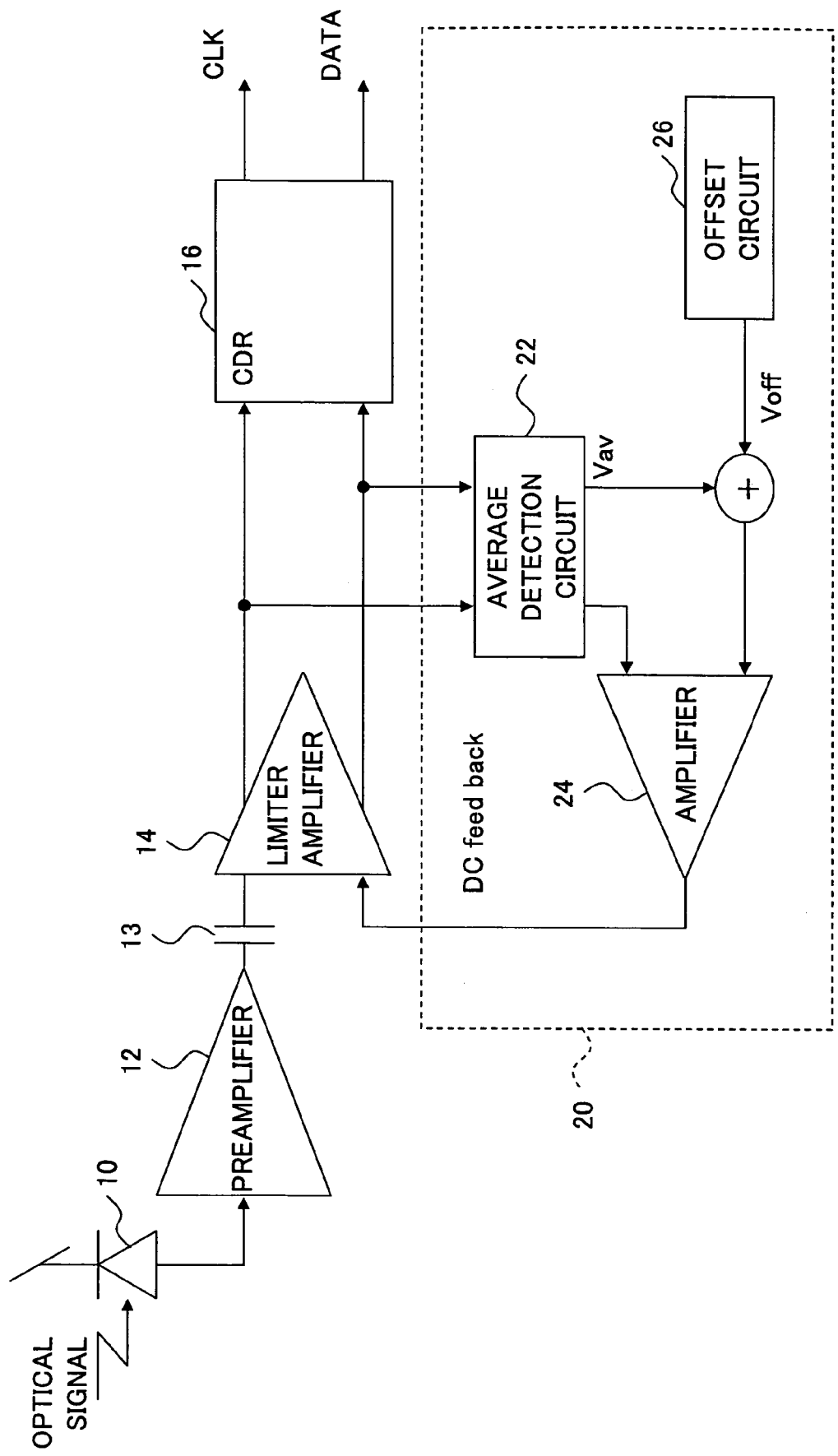
FIG. 1 is a block diagram illustrating an exemplary structure of a conventional optical receiver.

In the following, embodiments of the present invention will be described with reference to the accompanying drawings.

A description is given, with reference to FIG. 3 through FIG. 7, of an optical receiver according to a first embodiment of the present invention.

FIG. 3 is a block diagram illustrating an exemplary structure of an optical receiver according to the first embodiment.

Referring to FIG. 3, a light receiving element 30 converts an incoming optical signal from an optical fiber into a current signal, and a preamplifier 32 converts the current signal into a voltage signal. An input power detection circuit 31 detects an input power from a current in the light receiving element 30, and if the input power detection circuit 31 detects that an input of an optical signal has been stopped, the input power detection circuit 31 generates an optical input stop alarm signal.

A limiter amplifier 34 amplifies the voltage signal supplied from the preamplifier 32 via a capacitor 33 to an amplitude identifiable by CDR (Clock & Data Recovery) 36. CDR 36 finds a clock synchronous with the signal supplied from the limiter amplifier 34. Then, CDR 36 reproduces data by using the detected clock and supplies a clock CLK and data DATA to the next stage. On the other hand, if CDR 36 cannot find any clock synchronous with a signal supplied from the limiter amplifier 34, CDR 36 generates a synchronization error alarm signal.

An identification level control circuit 40 comprises an average detection circuit 42, an A/D converter 44, a memory 46, CPU (Central Processing Unit) 48, an OR circuit 50 and a D/A converter 52.

The average detection circuit 42 detects an average Vav of differences between a forward output and a backward output of the limiter amplifier 34. The average Vav is converted into a digital signal by the A/D converter 44 and is written in the memory 46.

The D/A converter 52 converts an operation result of CPU 48 into an analog signal, and supplies the converted analog signal to the limiter amplifier 34 as an identification level Vfbo.

The OR circuit 50, in response to receipt of a synchronization error alarm signal from CDR 36 or an optical input stop alarm signal from the input power detection circuit 31, supplies an operation start trigger to CPU 48.

As mentioned previously, conventional circuits have the problem that an identification level follows cross points of an input waveform. In the optical receiver according to the first embodiment, the identification level is kept at a predefined level independently of the input waveform. In order to realize this object, it is necessary to detect a high level and a low level of the input waveform.

Figures 2A, 2B:
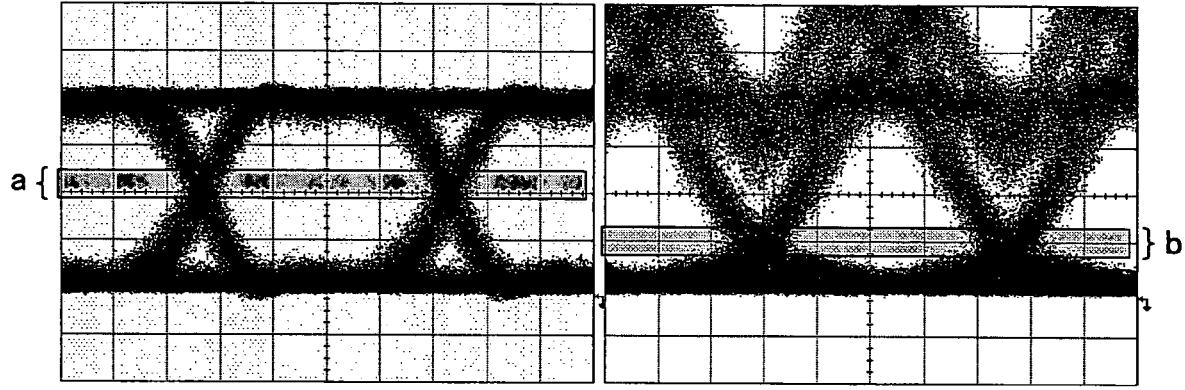
FIGS. 2A and 2B show exemplary optical waveform before and after optical fiber transmission, respectively.

For the detection, a peak detection approach is considered. However, since a strong overshoot arises in an optical waveform after optical fiber transmission as illustrated in FIG. 2B, a conventional peak detection circuit cannot detect the high level with high accuracy. In the following, a detection method of detecting a high level and a low level of an input waveform without necessity of such a peak detection circuit is described.

Figure 4:
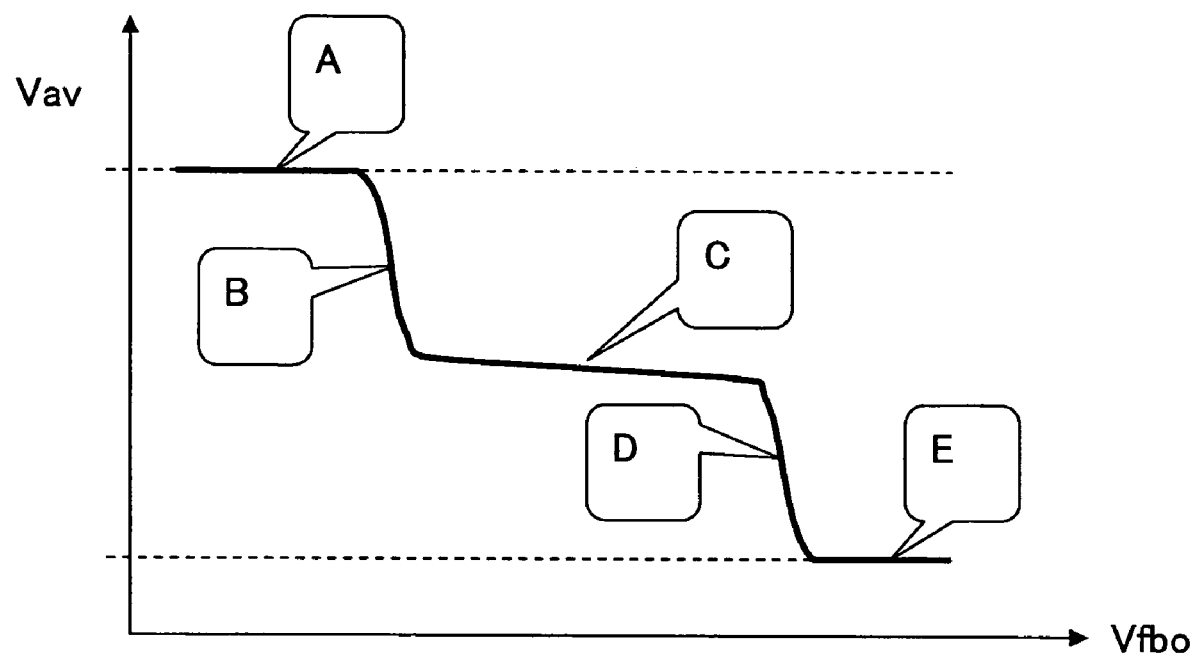
FIG. 4 shows an exemplary relation between an identification level Vfbo and an average Vav according to the first embodiment.

FIG. 4 shows an exemplary relation between an identification level Vfbo and an average Vav according to the first embodiment.

In FIG. 4, an exemplary relation between the identification level Vfbo and the average Vav of differences between a forward output and a backward output of the limiter amplifier 34 is illustrated as a solid curve for various identification levels Vfbo as an input to the limiter amplifier 34.

FIGS. 5A through 5E show exemplary relations between the identification level Vfbo and cut areas for an input waveform according to the first embodiment. In FIGS. 5A through 5E, cut areas "a" through "e" for an input waveform to the limiter amplifier 34, which correspond to cases where the average Vav is at respective points A through E in FIG. 4, are illustrated. FIGS. 6A through 6E show exemplary relations between the identification level Vfbo and output waveforms of the limiter amplifier 34 according to the first embodiment.

Figure 5A:
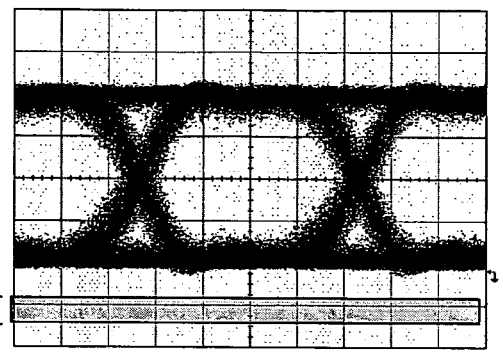
FIGS. 5A through 5E show exemplary relations between the identification level Vfbo and cut areas for an input waveform according to the first embodiment.
Figure 5B:
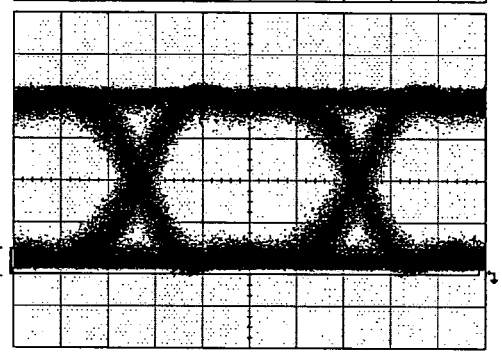
Figure 5C:
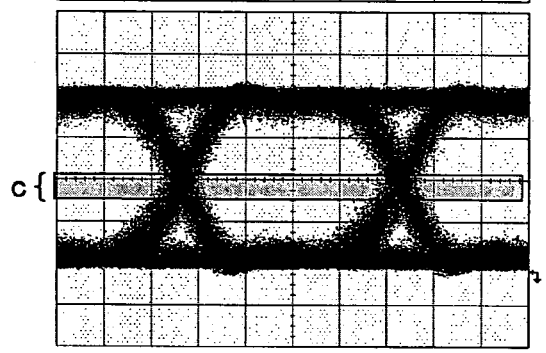
Figure 5D:
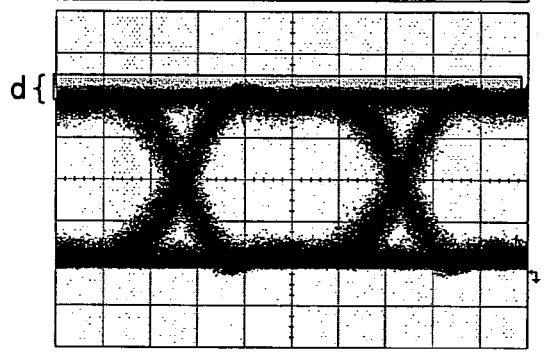
Figure 6A:
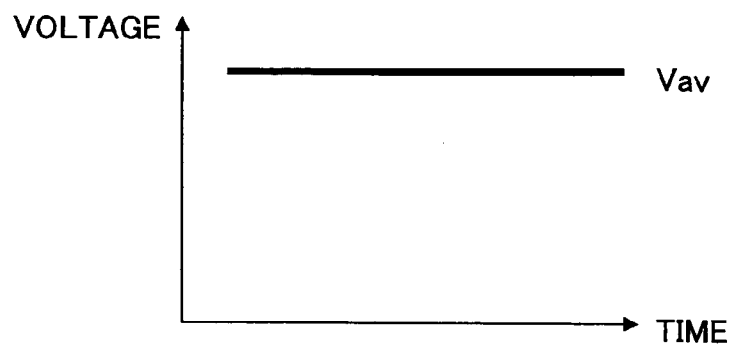
FIGS. 6A through 6E show exemplary relations between the identification level Vfbo and output waveforms of a limiter amplifier according to the first embodiment.

In a case where the average Vav is at the point A in FIG. 4, since the cutting position of the limiter amplifier 34 is lower than the input signal as illustrated in FIG. 5A, the limiter amplifier 34 supplies high level continuous DATA as illustrated in FIG. 6A.

Figure 5E:
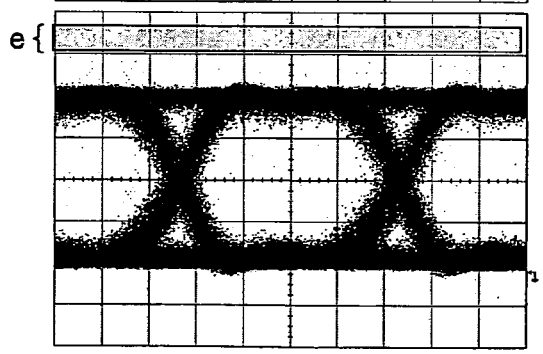
Figure 6B:
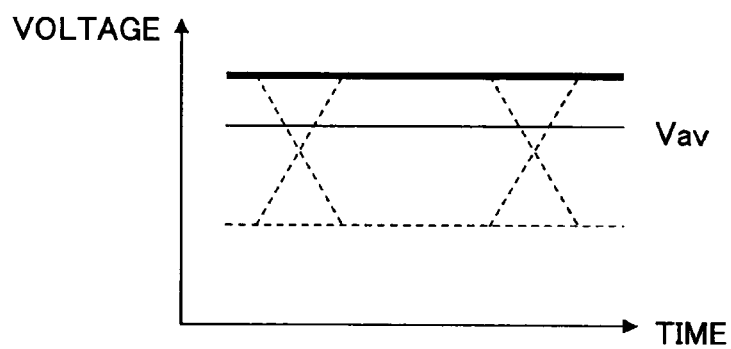
Figure 6C:
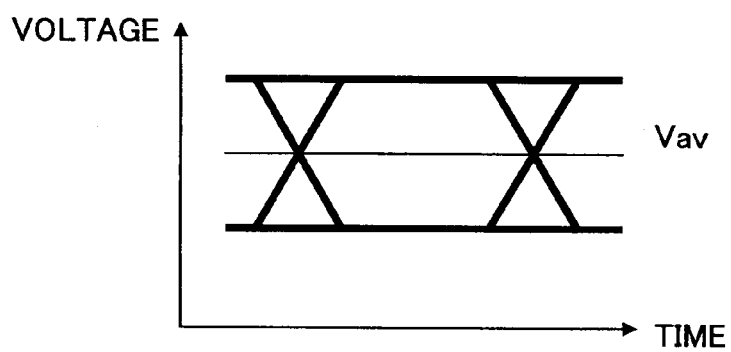
Figure 6D:
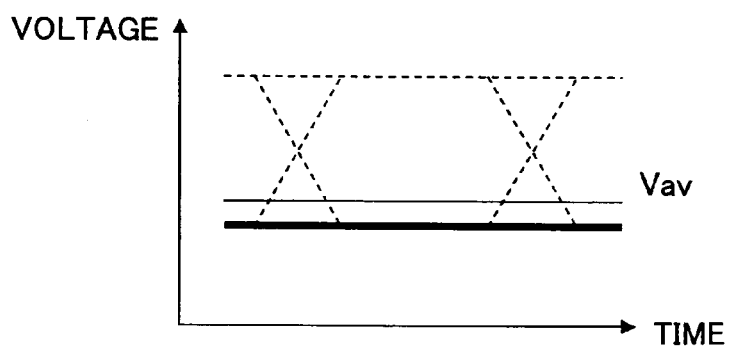
Figure 6E:
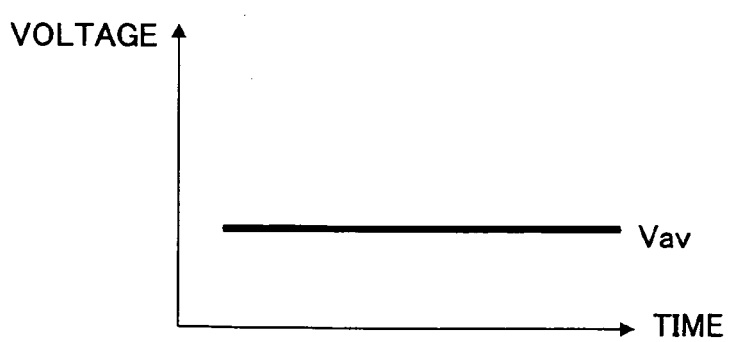

In a case where the average Vav is at the point E in FIG. 4, since the cutting position of the limiter amplifier 34 is upper than the input signal as illustrated in FIG. 5E, the limiter amplifier 34 supplies low level continuous DATA as illustrated in FIG. 6E.

In a case where the average Vav is at the point C in FIG. 4, since the cutting position of the limiter amplifier 34 is in a middle of the high level and the low level of the input signal, the limiter amplifier 34 supplies an output corresponding to a high level portion and a low level portion of the input signal. Normally, an input waveform includes the high level portion and the low level portion at a ratio of 1:1 (mark ratio of 1/2). Accordingly, the average Vav of the output of the limiter amplifier 34 is located in a middle of the high level and the low level as illustrated in FIG. 6C. Also, since cross points of an output waveform vary depending on cutting positions, the average Vav may be slightly different with respect to each of the left and right sides of the point C in FIG. 4.

In a case where the average Vav is at the point B in FIG. 4, since the identification level nearly overlaps the low level of the input signal to the limiter amplifier 34, the ratio of the high and low output level portions of the limiter amplifier 34 is changed drastically from 1:1 as illustrated in FIG. 6B.

Corresponding to the change, the average Vav is also changed into the condition of the point A in FIG. 4.

In a case where the average Vav is at the point D in FIG. 4., since the identification level nearly overlaps the high level of the input signal to the limiter amplifier 34, the ratio of the high and low output level portions of the limiter amplifier 34 is changed drastically from 1:1 as illustrated in FIG. 6D. Corresponding to the change, the average Vav is also changed into the condition of the point E in FIG. 4.

Accordingly, if the identification level Vfbo is in the condition where the average Vav is located at the point B, that is, if the identification level Vfbo is around 75% of an output amplitude of the limiter amplifier 34, the identification level Vfbo indicates the low level of the input waveform. On the other hand, if the identification level Vfbo is in the condition where the average Vav is located at the point D, that is, if the identification level Vfbo is around 25% of an output amplitude of the limiter amplifier 34, the identification level Vfbo indicates the high level of the input waveform. As a result, it is possible to detect the high level and the low level of an input waveform by monitoring the average Vav. Specifically, if the identification level Vfbo is set as an approximate middle level, which is actually about 30% to 40%, between the identification level Vfbo where the average Vav is in the condition of the point B and the identification level Vfbo where the average Vav is in the condition of the point D, it is possible to realize optimal identification.

While the identification level Vfbo is changed to detect the high level and the low level of an input signal, BER of a main signal is seriously degraded, thereby resulting in a synchronization error. Accordingly, it is impossible to perform an operation to detect an input signal level during operation of an optical receiver. However, since the waveform of an input optical signal drastically varies in either of cases where an optical receiver is newly installed in a transmitter or where an optical transmission path is replaced with another optical transmission path having a different dispersion value, waveform deformation cannot continuously change. Also, when an optical fiber transmission path is switched in a metro transmission apparatus, an optical input to an optical receiver is temporarily stopped.

For these reasons, if signal level detection is started in response to cancellation of an optical input stop alarm and a CDR synchronization error alarm, it is possible to detect the input signal level in most practical cases.

Figure 7:
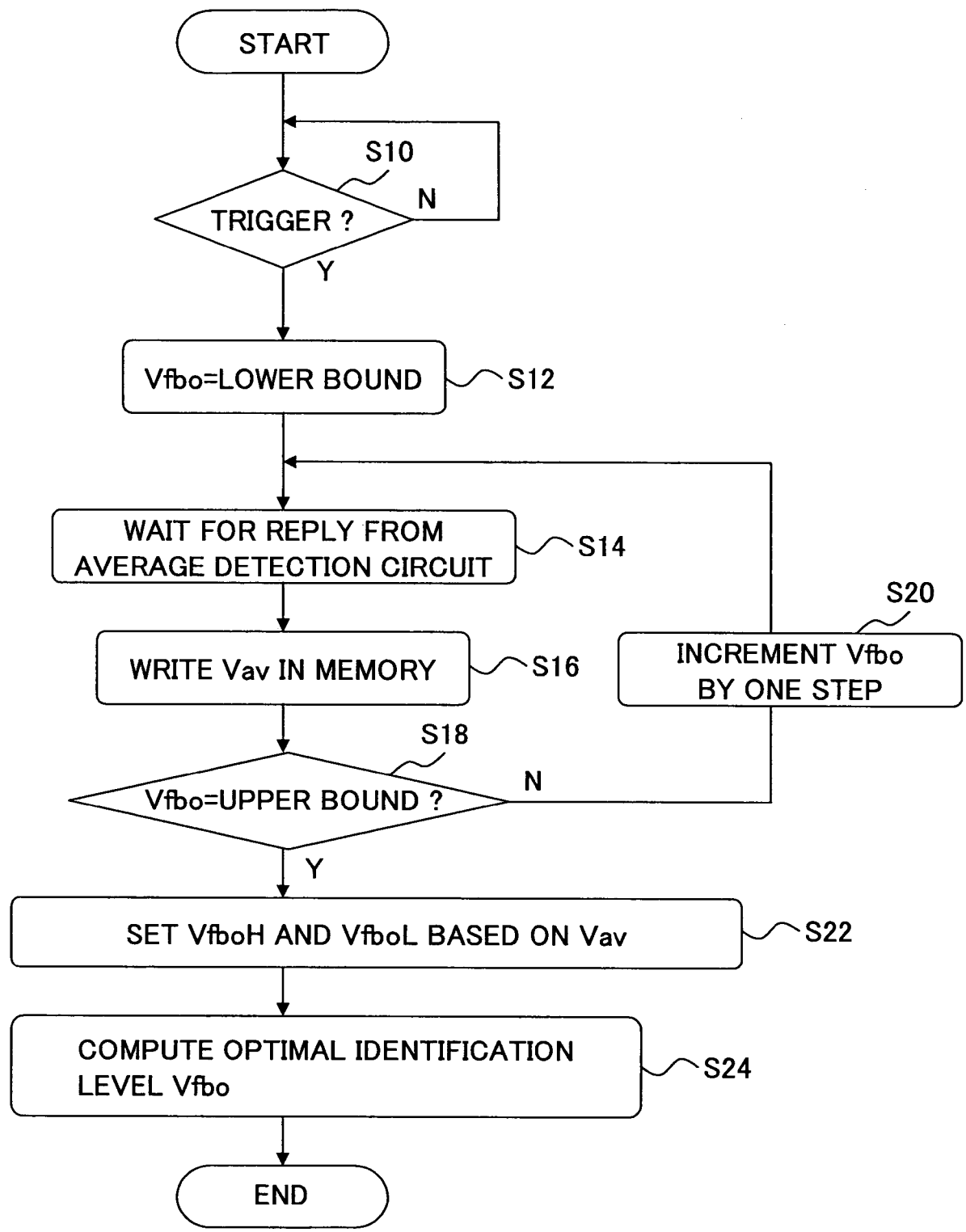
FIG. 7 is a flowchart of an exemplary operation to detect an input level and set a threshold according to the first embodiment.

FIG. 7 is a flowchart of an exemplary operation for CPU 48 to detect an input level and set a threshold according to the first embodiment.

Referring to FIG. 7, CPU 48 determines whether an optical input stop alarm or a synchronization error alarm is cancelled based on optical input stop alarm signal or a synchronization error alarm signal, respectivelt, at step S10. If such a trigger is detected, CPU 48 sets an identification level Vfbo to a lower bound thereof at step S12.

At step S14, CPU 48 waits for a reply from the average detection circuit 42. At step S16, CPU 48 writes an average Vav supplied from the average detection circuit 42 as well as the identification level Vfbo in the memory 46. At step S18, CPU 48 determines whether the identification level Vfbo reaches an upper bound thereof. If the identification level Vfbo is not the upper bound, CPU 48 increments the identification level Vfbo by one step (a small amount of voltage) at step S20, and the process control returns to step S14. Then, steps S14 through S20 are repeated.

On the other hand, if the identification level Vfbo is the upper bound, the process control proceeds to step S22. At step S22, CPU 48 sets identification levels VfboH and VfboL based on the average Vav. Specifically, if the minimum and maximum of the average Vav are set as 0% and 100%, respectively, the identification levels VfboH and VfboL are set as 25% and 75% of the average Vav, respectively.

At step S24, CPU 48 computes an optimal identification level Vfbo as follow;

$$Vfbo=(VfboH+VfboL)\times Thopt+VfboL,$$

where the notation "Thopt" represents a ratio of the optimal identification level, such as a value of about 0.3 to 0.4.

According to the first embodiment, the high level and the low level of an input waveform are detected, and the optimal identification level is determined based on the level information. As a result, it is possible to suppress influence of waveform deformation due to dispersion of an optical fiber as much as possible. Thus, it is possible to prevent degradation of BER as much as possible and improve dispersion tolerance.

Figure 8:
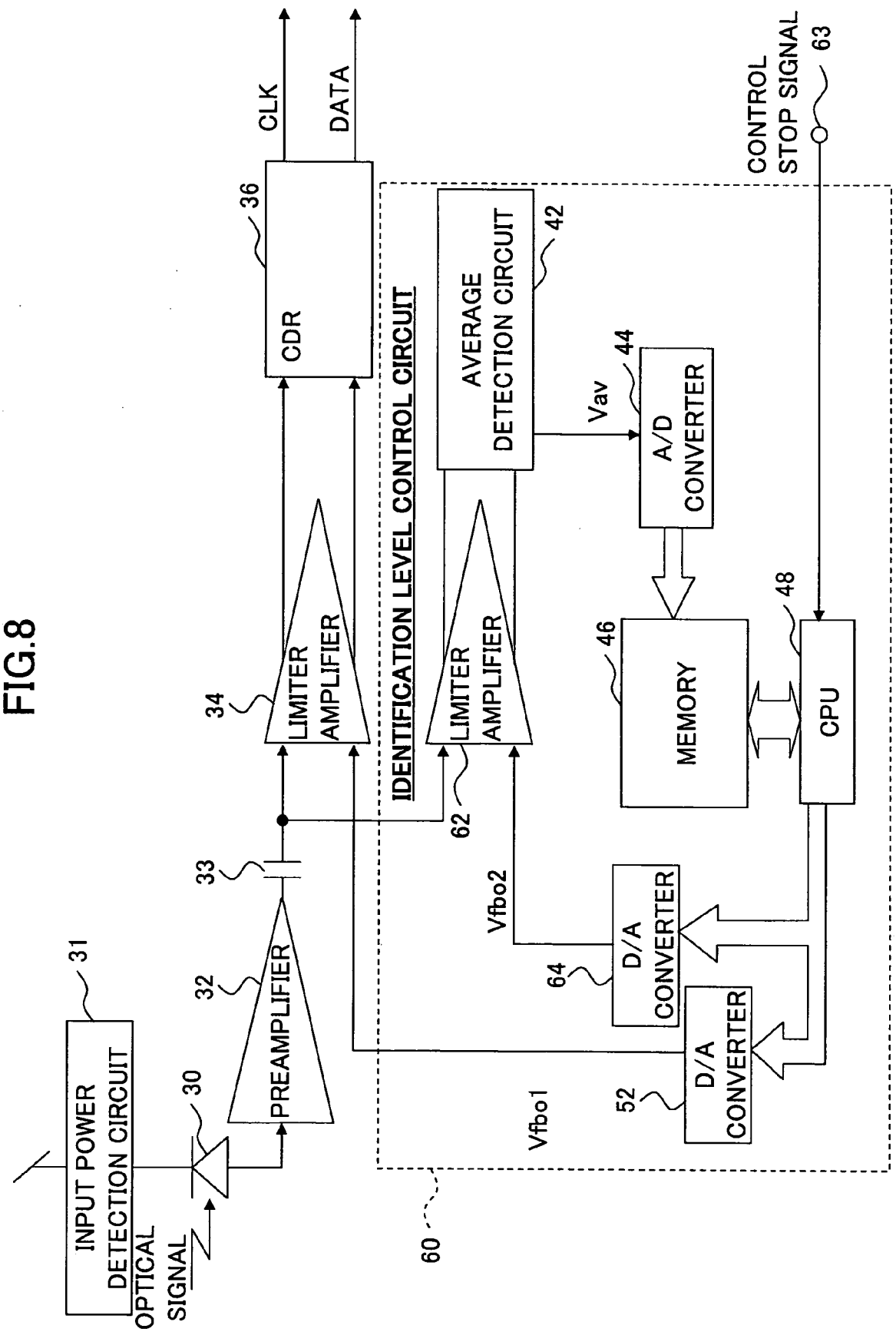
FIG. 8 is a block diagram illustrating an exemplary structure of an optical receiver according to a second embodiment of the present invention.
Figure 9:
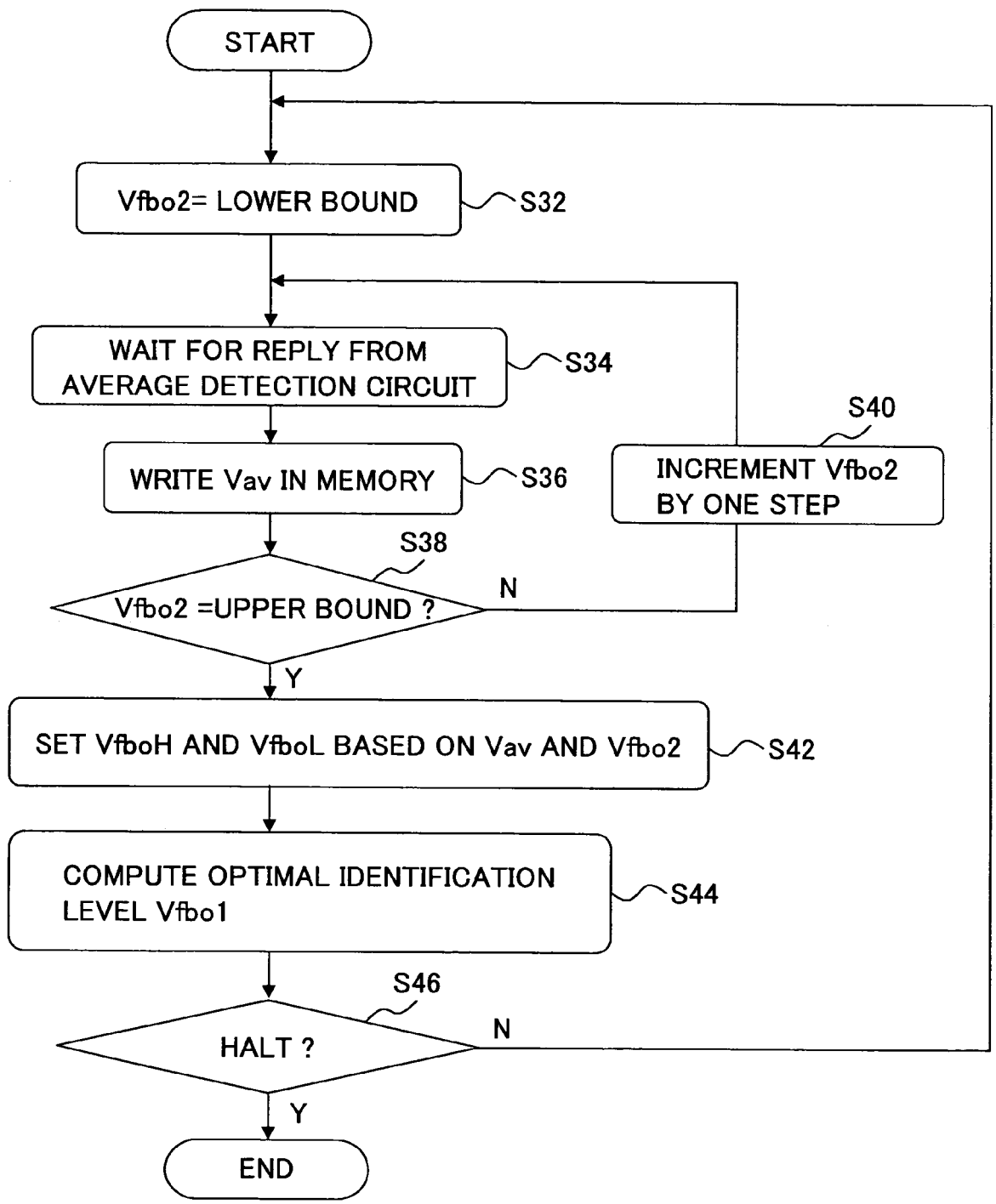
FIG. 9 is a flowchart of an exemplary operation to detect an input level and set a threshold according to the second embodiment.

A description is given, with reference to FIG. 8 and FIG. 9, of an optical receiver according to a second embodiment of the present invention.

In the first embodiment, after an identification level is computed/set in response to cancellation of an optical input stop alarm or a CDR synchronization error alarm, the identification level control circuit 40 does not operate until another trigger is provided again. Accordingly, if the power of an input optical signal is changed during operation of the optical receiver, or if an input offset of the limiter amplifier occurs due to environmental variations on temperature/power source during operation of an optical receiver, the set identification level may deviate from the optimal identification level, and thereby BER may be degraded. The second embodiment addresses this problem.

FIG. 8 is a block diagram illustrating an exemplary structure of an optical receiver according to the second embodiment. In FIG. 8, the same components as those in FIG. 3 are designated by the same reference numerals.

Referring to FIG. 8, a light receiving element 30 converts an optical signal supplied from an optical fiber into a current signal, and a preamplifier 32 converts the current signal into a voltage signal. Also, an input power detection circuit 31 detects an input power from a current conducted to the light receiving element 30, and if the input power detection circuit 31 detects that input of an optical signal has been stopped, the input power detection circuit 31 generates an optical input stop alarm signal.

A limiter amplifier 34 amplifies a signal supplied from the preamplifier 32 via a capacitor 33 to an amplitude identifiable by CDR 36. CDR 36 finds a clock synchronous with a signal supplied from the limiter amplifier 34. Then, CDR reproduces data by using the clock, and supplies a clock CLK and data DATA to the next stage.

An identification level control circuit 60 comprises a monitoring limiter amplifier 62, an average detection circuit 42, an A/D converter 44, a memory 46, CPU 48, and D/A converters 52 and 64.

The monitoring limiter amplifier 62 has the same features as the limiter amplifier 34 so as to monitor for statuses of the limiter amplifier 34 for amplifying a main signal. The average detection circuit 42 detects an average Vav of differences between a forward output and a backward output of the monitoring limiter amplifier 62. The average Vav is converted into a digital signal by the A/D converter 44 and is written in the memory 46.

The D/A converter 52 converts an operation result of CPU 48 into an analog signal, and supplies the converted analog signal to the limiter amplifier 34 as an identification level Vfbo1. The D/A converter 64 converts an operation result of CPU 48 into an analog signal, and supplies the converted analog signal to the monitoring limiter amplifier 62 as an identification level Vfbo2. CPU 48 may receive a control halt signal from an exterior of the identification level control circuit 60 via a terminal 63.

FIG. 9 is a flowchart of an exemplary operation for CPU 48 to detect an input level and set a threshold according to the second embodiment.

Referring to FIG. 9, CPU 48 sets an identification level Vfbo2 to a lower bound thereof at step S32. At step S34, CPU 48 waits for a reply from the average detection circuit 42. At step S36, CPU 48 writes an average Vav from the average detection circuit 42 as well as the identification level Vfbo2 in the memory 46. At step S38, CPU 48 determines whether the identification level Vfbo2 reaches an upper bound thereof. If the identification level Vfbo2 is not the upper bound, CPU 48 increments the identification level Vfbo2 by one step (a small amount of voltage) at step S40, and the process control returns to step S34; Then, steps S34 through S40 are repeated.

On the other hand, if the identification level Vfbo2 is the upper bound, the process control proceeds to step S42. At step S42, CPU 48 sets identification levels VfboH and VfboL based on the average Vav and the identification level Vfbo2. Specifically, if the minimum and maximum of the average Vav are set as 0% and 100%, respectively, the identification levels VfboH and VfboL are set as levels of the identification level Vfbo2 such that the average Vav has 25% and 75%, respectively.

At step S44, CPU 48 computes an optimal identification level Vfbo1 as follow;

$$Vfbo1=(VfboH+VfboL) \times Thopt+VfboL,$$

where the notation "Thopt" represents a ratio of the optimal identification level, such as a value of about 0.3 to 0.4.

According to the second embodiment, the high level and the low level of an input waveform is always detected, and the optimal identification level is determined based on the level information. As a result, it is possible to suppress influence of waveform deformation due to dispersion of an optical fiber as much as possible regardless of variations of input optical power and environmental variations such as temperature variations and power source variations. Thus, it is possible to prevent degradation of BER as much as possible and improve dispersion tolerance.

It is noted that steps S12 through S16, S20, S32 through S36 and S40 correspond to a change part. Also, steps S16 and S36 correspond to a storage part. Steps S22, S24, S42 and S44 correspond to a computation part.

The present invention is not limited to the specifically disclosed embodiments, and variations and modifications may be mode without departing from the scope of the present invention.

What is claimed is:

1. A method of controlling an identification level for an optical receiver wherein the optical receiver converts an optical signal from an optical fiber into an electric signal, uses a limiter amplifier to amplify the electric signal, and reproduces data, the method comprising:

changing an identification level supplied to the limiter amplifier between a lower bound and an upper bound thereof and storing a respective average of an output of the limiter amplifier corresponding to each identification level together with the identification level;

setting a first average between a minimal value of the respective averages and a predefined value and a second average between a maximal value of the respective averages and the predefined value, said predefined value being between the minimal value and the maximal value, and obtaining a first identification level corresponding to the first average and a second identification level corresponding to the second average; and computing an optimal identification level based on the first identification level and the second identification level and supplying the optimal identification level to the limiter amplifier.

2. The method as claimed in claim 1, wherein the first average and the second average are substantially equal to Min +0.25(Max-Min) and Min +0.75(Max-Min), wherein the minimal value and the maximum value are represented by Min and Max, respectively.

3. The method as claimed in claim 1, wherein the optimal identification level is set between (ld1+0.3(ld2−ld1)) and (ld1+0.4(ld2−ld1)), wherein the first identification level and the second identification level are represented by ld1 and ld2, respectively.

4. A method of controlling an identification level for an optical receiver wherein the optical receiver converts an optical signal from an optical fiber into an electric signal, uses a limiter amplifier to amplify the electric signal, and reproduces data, the method comprising:

changing an identification level supplied to a monitoring limiter amplifier between a lower bound and an upper bound thereof, said monitoring limiter amplifier receiving the electric signal, and storing a respective average of an output of the monitoring limiter amplifier corresponding to each identification level together with the identification level;

setting a first average between a minimal value of the respective averages and a predefined value and a second average between a maximal value of the respective averages and the predefined value, said predefined value being between the minimal value and the maximal value, and obtaining a first identification level corresponding to the first average and a second identification level corresponding to the second average; and computing an optimal identification level based on the first identification level and the second identification level and supplying the optimal identification level to the limiter amplifier.

5. The method as claimed in claim 4, wherein the first average and the second average are substantially equal to Min +0.25(Max-Min) and Min +0.75(Max-Min), wherein the minimal value and the maximum value are represented by Min and Max, respectively.

6. The method as claimed in claim 4, wherein the optimal identification level is set between (ld1+0.3(ld2−ld1)) and (ld1+0.4(ld2−ld1)), wherein the first identification level and the second identification level are represented by ld1 and ld2, respectively.

7. An optical receiver for converting an optical signal from an optical fiber into an electric signal, using a limiter amplifier to amplify the electric signal, and reproducing data, comprising:

a change part changing an identification level supplied to the limiter amplifier between a lower bound and an upper bound thereof;

a storage part storing a respective average of an output of the limiter amplifier corresponding to each identification level together with the identification level; and a computation part setting a first average between a minimal value of the respective averages and a predefined value and a second average between a maximal value of the respective averages and the predefined value, said predefined value being between the minimal value and the maximal value, obtaining a first identification level corresponding to the first average and a second identification level corresponding to the second average, computing an optimal identification level based on the first identification level and the second identification level, and supplying the optimal identification level to the limiter amplifier.

8. The optical receiver as claimed in claim 7, wherein the first average and the second average are substantially equal to Min +0.25(Max-Min) and Min +0.75(Max-Min), wherein the minimal value and the maximum value are represented by Min and Max, respectively.

9. The optical receiver as claimed in claim 7, wherein the optimal identification level is set between (ld1+0.3(ld2−ld1)) and (ld1+0.4(ld2−ld1)), wherein the first identification level and the second identification level are represented by ld1 and ld2, respectively.

10. An optical receiver for converting an optical signal from an optical fiber into an electric signal, using a limiter amplifier to amplify the electric signal, and reproducing data, comprising:

a monitoring limiter amplifier receiving the electric signal;

a change part changing an identification level supplied to the monitoring limiter amplifier between a lower bound and an upper bound thereof;

a storage part storing a respective average of an output of the monitoring limiter amplifier corresponding to each identification level together with the identification level; and a computation part setting a first average between a minimal value of the respective averages and a predefined value and a second average between a maximal value of the respective averages and the predefined value, said predefined value being between the minimal value and the maximal value, obtaining a first identification level corresponding to the first average and a second identification level corresponding to the second average, computing an optimal identification level based on the first identification level and the second identification level, and supplying the optimal identification level to the limiter amplifier.

11. The optical receiver as claimed in claim 10, wherein the first average and the second average are substantially equal to Min +0.25(Max-Min) and Min +0.75(Max-Min), wherein the minimal value and the maximum value are represented by Min and Max, respectively.

12. The optical receiver as claimed in claim 10, wherein the optimal identification level is set between (ld1+0.3(ld2−ld1)) and (ld1+0.4(ld2−ld1)), wherein the first identification level and the second identification level are represented by ld1 and ld2, respectively.

* * * * *